(12) United States Patent
Wang et al.

(10) Patent No.: US 11,715,634 B2
(45) Date of Patent: Aug. 1, 2023

(54) WET CLEAN PROCESS FOR FABRICATING SEMICONDUCTOR DEVICES

(71) Applicant: NANYA TECHNOLOGY CORPORATION, New Taipei (TW)

(72) Inventors: Rou-Wei Wang, Taipei (TW); Jen-I Lai, Taoyuan (TW); Chun-Heng Wu, Taoyuan (TW); Jr-Chiuan Wang, New Taipei (TW); Chia-Che Chiang, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 328 days.

(21) Appl. No.: 17/243,159

(22) Filed: Apr. 28, 2021

(65) Prior Publication Data
US 2022/0351961 A1 Nov. 3, 2022

(51) Int. Cl.
*H01L 21/02* (2006.01)
*H01L 21/762* (2006.01)

(52) U.S. Cl.
CPC .. *H01L 21/02052* (2013.01); *H01L 21/02057* (2013.01); *H01L 21/76224* (2013.01); *H01L 21/76283* (2013.01)

(58) Field of Classification Search
CPC ......... H01L 21/02052; H01L 21/76224; H01L 21/02057; H01L 21/3065; H01L 21/76283
USPC .................................................. 438/424, 694
See application file for complete search history.

(56) References Cited

U.S. PATENT DOCUMENTS

| 8,536,018 B1 | 9/2013 | Anderson et al. |
| 2005/0277247 A1 | 12/2005 | Wu et al. |
| 2011/0189858 A1* | 8/2011 | Yassari et al. ...... H01L 21/3138 438/694 |

FOREIGN PATENT DOCUMENTS

| TW | 511248 B | 11/2002 |
| TW | 544803 B | 8/2003 |
| TW | 201707139 A | 2/2017 |

* cited by examiner

*Primary Examiner* — Thinh T Nguyen
(74) *Attorney, Agent, or Firm* — Muncy, Geissler, Olds & Lowe, P.C.

(57) ABSTRACT

The disclosure provides a pattern collapse free wet clean process for fabricating semiconductor devices. By performing post reactive ion etching (RIE) using a fluorine-containing gas such as $C_2F_6$, followed by cleaning in a single wafer cleaner (SWC) with diluted hydrofluoric acid (HF) or in a solution of ammonia and HF, a substrate with multiple pattern collapse free high aspect ratio shallow trench isolation (STI) features can be obtained.

14 Claims, 7 Drawing Sheets

10

Providing a substrate comprising a pad oxide layer disposed above the substrate, and an oxide layer disposed above the pad oxide layer — S101

Dry etching the substrate to form multiple high-aspect-ratio shallow trench isolation (STI) features on the substrate and to simultaneously remove the oxide layer from the substrate — S102

Cleaning the substrate in a single wafer cleaner (SWC) with diluted hydrofluoric acid (HF) or in a solution of ammonia and HF to remove polymer residues left behind by the dry etching step and the pad oxide layer from the substrate — S103

Vapor etching the substrate with an HF vapor to form a substrate with multiple pattern collapse free high-aspect-ratio STI features — S104

WET CLEAN PROCESS FOR FABRICATING SEMICONDUCTOR DEVICES

TECHNICAL FIELD

The present disclosure relates generally to a method for fabricating a semiconductor device and, more particularly, to a wet clean process for fabricating a semiconductor device.

DISCUSSION OF THE BACKGROUND

Recent trends in developing semiconductor devices with smaller sizes and greater integration density have resulted in reduced distance between transistors. Shallow trench isolation (STI) is currently the most widely applied method of isolating transistors. STI has replaced the conventional method of local oxidation of silicon (LOCOS) to satisfy the requirements for semiconductor generations of less than 0.18 microns. In general, a "deep trench" may extend between 4 and 8 μm below the substrate surface at a given stage in the fabrication process. Deep trenches are typically high aspect ratio trenches. The "aspect ratio" is the ratio of the depth of a trench compared to the width of the opening at the top of the trench. By way of example, high aspect ratio trenches in advanced semiconductor manufacturing may have an aspect ratio of between 20:1 and 60:1 or higher.

As the sizes of semiconductor devices become smaller with critical dimensions (CD) of less than 50 nm, fabrication of arrays having high aspect ratio trenches using wet strip processes can result in distortion, e.g., bending, of trench boundaries, or a pattern collapse. The pattern collapse phenomenon was first observed in back end of line (BEOL) applications using an ultra low-k film scheme. With the ongoing reductions in dimensions and pitch, the pattern collapse defects occurring during a wet clean process are increasing in frequency. Moreover, collapse problems frequently occur in a photoresist layer due to the high aspect ratio of the patterns. The pattern collapse phenomenon can cause leakage and short circuiting of a semiconductor device, which in turn results in low yield.

Post-etch investigation has confirmed that, in prior art manufacturing, bending typically occur during, rather than prior to, a wet-strip processes. This observation confirms that the bending is caused by capillary forces on trench side walls that arise during the wet strip process. Eliminating wet stripping from the fabrication process, however, is not a viable or attractive solution to the bending/collapse problem, as wet stripping provides a powerful tool, e.g., for removal of polymer residue.

Therefore, a need exists in the semiconductor manufacturing industry for a method for processing a substrate (e.g., a wafer) for semiconductor devices in such a way as to reduce or eliminate collapse of high aspect ratio features on the substrate, particularly features having an aspect ratio of approximately 10 or greater.

This Discussion of the Background section is provided for background information only. The statements in this Discussion of the Background are not an admission that the subject matter disclosed in this section constitutes prior art with respect to the present disclosure, and no part of this Discussion of the Background section may be used as an admission that any part of this application, including this Discussion of the Background section, constitutes prior art with respect to the present disclosure.

SUMMARY

To meet the foregoing need, and in accordance with the purpose of the present disclosure, a wet clean process for fabricating semiconductor devices is provided. The process can be generally characterized as comprising the following steps: providing a substrate comprising a pad oxide layer disposed above the substrate, and an oxide layer disposed above the pad oxide layer; dry etching the substrate to form multiple high aspect ratio shallow trench isolations (STI) on the substrate and to simultaneously remove the oxide layer from the substrate; cleaning the substrate in a single wafer cleaner (SWC) with diluted hydrofluoric acid (HF) or in a solution of ammonia and HF to remove polymer residues left behind by the dry-etching step and the pad oxide layer from the substrate; and vapor etching the substrate with an HF vapor to form a substrate with multiple-pattern collapse-free high aspect ratio STI features.

In some embodiments, the substrate is a silicon-on-insulator (SOI) substrate.

In some embodiments, the pad oxide layer is a $SiO_2$ buffer layer.

In some embodiments, the oxide layer is a tetraethylorthosilicate (TEOS) layer.

In some embodiments, the dry etching is performed by post reactive ion etching (RIE) using a fluorine-containing gas.

In some embodiments, the fluorine-containing gas is selected from the group consisting of $CF_4$, $CH_2F_2$, $CHF_3$, and $C_2F_6$.

In some embodiments, the fluorine-containing gas is $C_2F_6$.

In some embodiments, the dry-etching step forms multiple high aspect ratio STI features on the substrate wherein an aspect ratio of at least a portion of the multiple high aspect ratio STI features is 20:1 or greater.

In some embodiments, the dry-etching step forms multiple high aspect ratio STI features on the substrate wherein an aspect ratio of at least a portion of the multiple high aspect ratio STI features is between 20:1 and 60:1.

In some embodiments, the dry-etching step forms multiple high aspect ratio STI features on the substrate wherein an aspect ratio of at least a portion of the multiple high aspect ratio STI features is between 30:1 and 60:1.

In some embodiments, the cleaning step is performed using diluted HF at a concentration of 0.5% or greater.

In some embodiments, the cleaning step is performed using diluted HF at a concentration of between 1% and 5%.

In some embodiments, the vapor-etching step is performed with an HF vapor in the presence of alcohols.

Due to the design of the method of the present disclosure, which includes performing post RIE using a fluorine-containing gas such as $C_2F_6$ followed by cleaning in an SWC with diluted HF or in a solution of ammonia and HF, a substrate with multiple pattern collapse free high aspect ratio STI features can be obtained. Due to a significant reduction or elimination of collapse phenomenon in the semiconductor device, the yield of the semiconductor device is increased.

The foregoing has outlined rather broadly the technical features and advantages of the present disclosure in order that the detailed description of the disclosure that follows may be better understood. Additional technical features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Embodiments (or examples) of the disclosure illustrated in the drawings are now described using specific language. It shall be understood that no limitation to the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

The terminology used herein is for the purpose of describing particular example embodiments only, and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Further, spatially relative terms, such as "greater," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The apparatus may be otherwise oriented (rotated 90 degrees or at other orientations) and the spatially relative descriptors used herein may likewise be interpreted accordingly.

The present disclosure will be described in detail with reference to the accompanying drawings with numbered elements. It should be noted that the drawings are in greatly simplified form and are not drawn to scale. Moreover, dimensions have been exaggerated in order to provide a clear illustration and understanding of the present invention.

Figure 1:
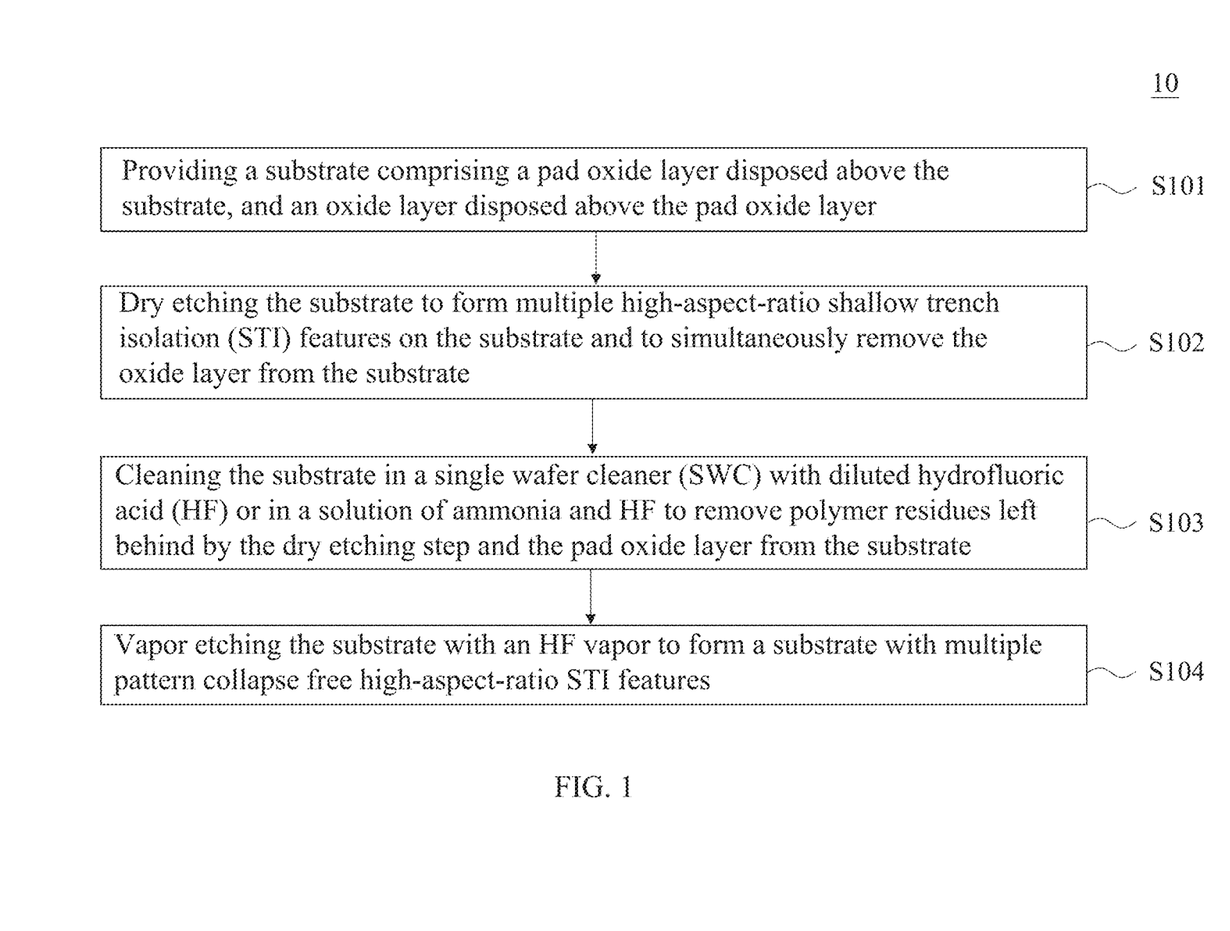
FIG. 1 is a flowchart of a wet clean process for fabricating semiconductor devices in accordance with some embodiments of the present disclosure.

The wet clean process for fabricating semiconductor devices of the present disclosure will be explained in detail below along with drawings. FIG. 1 is a flow diagram of a wet clean process 10 of the present disclosure, and FIGS. 2A and 2B, FIGS. 3A and 3B, FIGS. 4A to 4D, and FIGS. 5A to 5D are top views or sectional views showing a semiconductor structure after steps of the process are performed in accordance with some embodiments of the present disclosure.

Figure 2A:
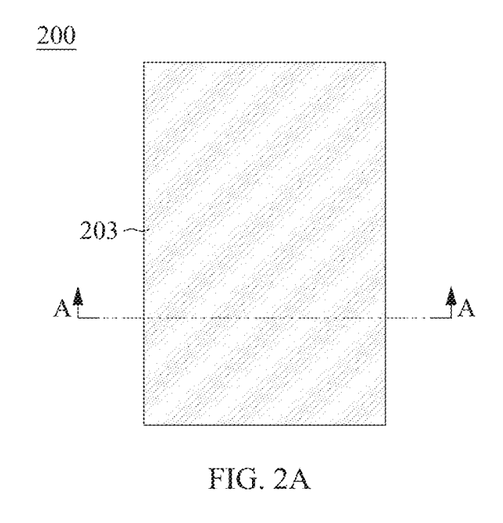
FIG. 2A is a top view of a semiconductor structure after step S101 in FIG. 1 is performed.
Figure 2B:
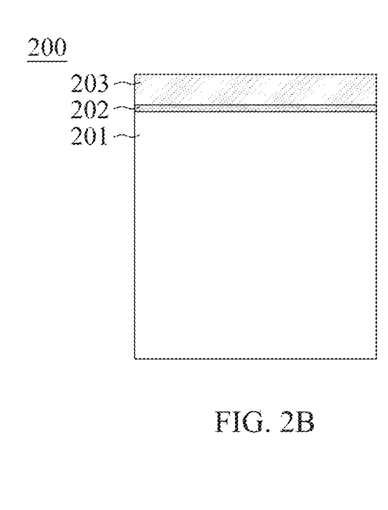
FIG. 2B is a schematic cross-sectional view, taken along line A-A in FIG. 2A, of the semiconductor structure after the step S101 in FIG. 1 is performed.

Referring more particularly to FIG. 1 and FIGS. 2A and 2B, in step S101, a pad oxide layer 202 is grown on a surface of a substrate 201, and an oxide layer 203 is grown above the pad oxide layer 202.

In the present disclosure, a semiconductor device generally means a device which can function by utilizing semiconductor characteristics, and an electro-optic device, a light-emitting display device, a semiconductor circuit, and an electronic device are all included in a category of the semiconductor device. In addition, pattern collapse can refer to unintended contact between adjacent features after wet processing and drying. In particular, the contact can occur during drying and remain after drying is complete. Below a location of the contact, underlying features of a pattern are not destroyed, but instead is the features are deformed, i.e., they have been bent toward one another to form a contact.

In the present disclosure, the term "substrate" means and includes a base material or construction upon which materials are formed. It will be appreciated that the substrate may include a single material, a plurality of layers of different materials, a layer or layers having regions of different materials or different structures in them, or other combinations. These materials may include semiconductors, insulators, conductors, or combinations thereof. For example, the substrate may be a semiconductor substrate, a base semiconductor layer on a supporting structure, a metal electrode, or a semiconductor substrate having one or more layers, structures or regions formed thereon. The substrate may be a conventional silicon substrate or other bulk substrate including a layer of semi-conductive material. In some embodiments, the substrate 201 may be a silicon (Si) substrate, a germanium (Ge) substrate, a silicon germanium (SiGe) substrate, a silicon-on-sapphire (SOS) substrate, a silicon-on-quartz substrate, a silicon-on-insulator (SOI) substrate, a III-V compound semiconductor, combinations thereof, or the like. Preferably, the substrate 201 is an SOI substrate. In general, a composite layer structure, such as SOI, is produced by placing two wafers in direct contact, thereby initiating bonding by van der Waals forces, followed by a thermal treatment to strengthen the bond. A choice of insulator depends largely on an intended application, with sapphire being used for high-performance radio frequency (RF) and radiation-sensitive applications, and silicon dioxide being used for diminished short-channel effects in other microelectronics devices. In some embodiments, the substrate is a composite layer structure, which generally comprises a handle wafer or layer, a device isolation layer, and an insulating (i.e., dielectric) film (typically an oxide layer) between the handle layer and the device isolation layer. Generally, the device layer is between 0.01 and 20 micrometers thick, such as between 0.05 and 20 micrometers thick. Thick film device layers may have a device layer thickness between about 1.5 micrometers and about 20 micrometers. Thin film device layers may have a thickness between about 0.01 micrometer and about 0.20 micrometer.

A material of the pad oxide layer 202 may include silicon oxide (SiO), hafnium oxide ($HfO_2$), hafnium silicon oxide ($HfSiO_4$), zirconium silicon oxide ($ZrSiO_4$), or a combination thereof. In a preferred embodiment, the pad oxide layer 202 is a $SiO_2$ buffer layer. By way of illustration, the pad oxide layer 202 (e.g., a $SiO_2$ buffer layer) may be grown by thermal oxidation on the semiconductor substrate 201. Usually, thermal oxidation is performed at a temperature ranging from 800° C. to 1,200° C. During thermal oxidation, the substrate such as a silicon wafer is consumed and replaced by silicon oxide. For instance, the pad oxide layer 202 may include silicon oxide, silicon nitride, silicon oxynitride, or a combination thereof and may be formed as a single layer or a multilayered structure. In some embodiments, a thickness of the pad oxide layer 202 is between about 150 Å and about 2000 Å.

By way of illustration, the oxide layer 203 may be formed using a technique such as a thin-film related manufacturing process. In one embodiment, the oxide layer 203 may be formed from a process gas comprising tetraethylorthosilicate (TEOS) and nitrous oxide ($N_2O$). In another embodiment, the oxide layer 203 may be formed from a process gas comprising TEOS and oxygen ($O_2$). In either case, the process gas may include one or more carrier gases (for example, an inert gas such as helium (He) or argon (Ar)) to facilitate delivery and distribution of the process gas within a process chamber. In one example, the process gas includes TEOS, $N_2O$ and Ar. In another example, the process gas includes TEOS, HE, and $O_2$. In some embodiments, the oxide layer can be formed from plasma-enhanced oxide (PEOX), undoped silicate glass (USG) or the like. In some embodiments, the oxide layer is a TEOS layer. In some embodiments, a thickness of the oxide layer 203 is between about 150 Å and about 2000 Å.

Figure 3A:
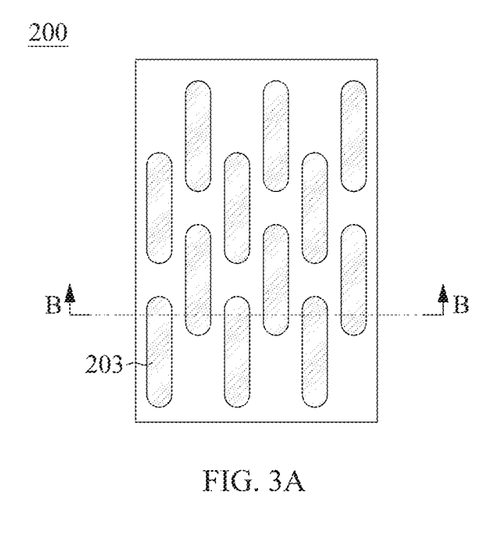
FIG. 3A is a top view of the semiconductor structure after step S102 in FIG. 1 is performed.
Figure 3B:
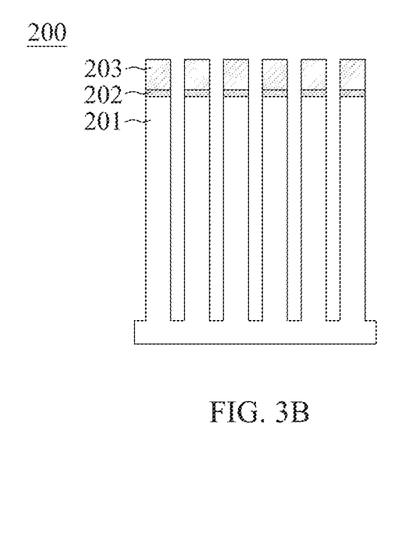
FIG. 3B is a schematic cross-sectional view, taken along line B-B in FIG. 3A, of the semiconductor structure after the step S102 in FIG. 1 is performed.

With reference to FIG. 1 and FIGS. 3A and 3B, in the step S102, a dry-etching process is performed to etch the pad oxide layer 202 and the substrate 201. The pad oxide layer 202 and an upper portion of the substrate 201 may be partially removed by the dry-etching process, thereby forming multiple high aspect ratio STI features on the substrate 201. A size of the multiple high aspect ratio STI features can be in a range of 32 nm or less. Although shown as equal, a spacing between the multiple high aspect ratio STI features can vary between different pairs of adjacent features. It should be noted that the spacing between the multiple high aspect ratio STI features can be a factor in pattern collapse.

In some embodiments, the dry-etching step may be performed using an oxygen-containing gas, a fluorine-containing gas (e.g., $CF_4$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, or combinations thereof. Preferably, the dry-etching step is performed using a fluorine-containing gas. More preferably, the dry-etching step is performed using a fluorocarbon gas having a chemical formula of $C_nF_xH_y$, wherein n is an integer of 1 or 2, x is an integer between 1 and 6, and y is an integer between 0 and 3. In some embodiments, (x+y) is equal to 6. In some embodiments, the fluorocarbon gas may be $CF_4$, $C_2F_6$, $CHF_3$, or a combination thereof. Most preferably, the dry-etching step is performed using $C_2F_6$.

In a preferred embodiment, the dry-etching step is performed by post reactive ion etching (RIE). RIE serves many important microfabrication functions, including patterning of trench/via features on low-k or ULK ILD, ashing/removal of photoresist, etching/removal of BARCs, minimizing/removal of plasma-etch polymers, etching/removal of organic contaminations, and restoration from damage to low-k materials. After the step S102 is performed, the oxide layer 203 is removed from the substrate 201, and multiple high aspect ratio STI features are formed on the substrate 201. The multiple high aspect ratio STI features are separated from each other in a cross-sectional view.

In some embodiments, the dry-etching process forms multiple high aspect ratio STI features on the substrate 201 wherein an aspect ratio of at least a portion of the multiple high aspect ratio STI features is 20:1 or greater, preferably between 20:1 and 60:1, and more preferably between 30:1 and 60:1. A characteristic dimension of the STI features, such as a width of the features, can be less than 40 nm. In other embodiments, the characteristic dimension can be less than 30 nm. In a particular embodiment, the characteristic dimension can be less than 25 nm.

As a design rule of semiconductor devices decreases to a submicron scale, a tolerable size of contaminants produced during a fabrication process is also decreased. The submicron-sized contaminants (or particles) are difficult to displace because of strong adhesion forces between the particles and the substrate, such as by van der Waals forces, capillary forces, chemical bonding, and/or electrostatic forces. A pre-cleaning process using a reducing agent may be optionally performed to remove the submicron-sized contaminants from a surface of the substrate. The reducing agent may be titanium tetrachloride, tantalum tetrachloride, or a combination thereof. If desired, the pre-cleaning process may be repeated several times.

Figure 4A:
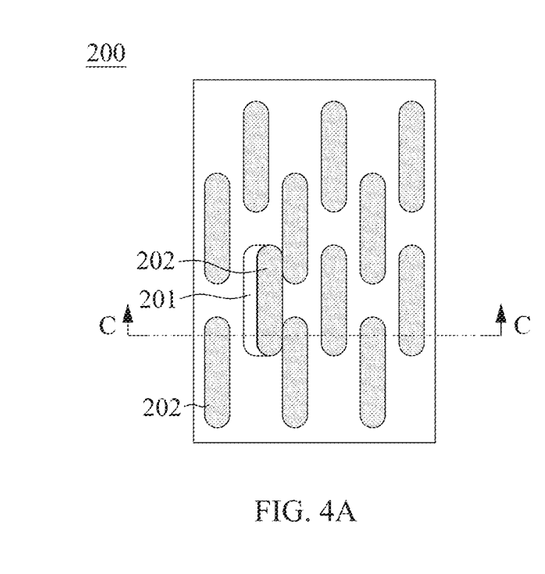
FIG. 4A is a top view of the semiconductor structure after step S103 in FIG. 1 is performed.
Figure 4B:
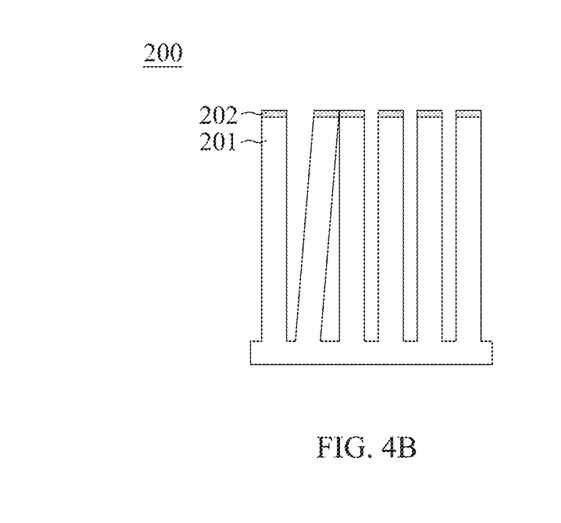
FIG. 4B is a schematic cross-sectional view, taken along line C-C in FIG. 4A, of the semiconductor structure after the step S103 in FIG. 1 is performed.
Figure 4C:
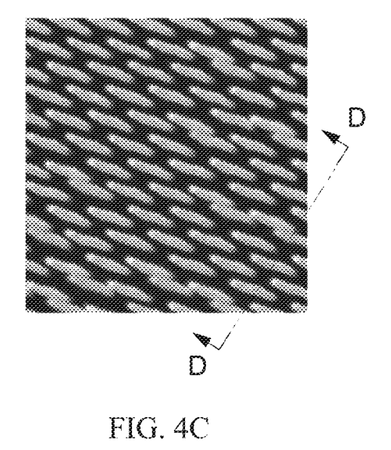
FIG. 4C is a micrograph of a top view of the semiconductor structure after the step S103 in FIG. 1 is performed.
Figure 4D:
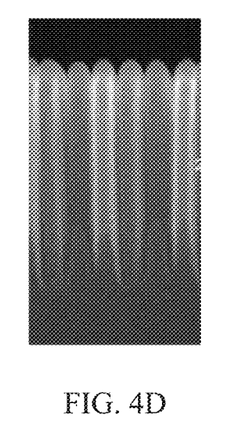
FIG. 4D is a micrograph of a cross-sectional view, taken along line D-D in FIG. 4C, of the semiconductor structure after the step S103 in FIG. 1 is performed.

With reference to FIG. 1 and FIGS. 4A and 4B, in the step S103, the substrate 201 is subjected to a cleaning process in an SWC with diluted HF or in a solution of ammonia and HF. After the step S103 is performed, polymer residues left behind by the dry-etching process are removed from the substrate 201, and the pad oxide layer 202 is also removed from the substrate 201. Single wafer cleaners (SWCs) are commonly used in microelectronic processes for their high performance in cleaning wafers of large diameters (in particular 300 mm) Specifically, the SWCs make it possible to limit certain defects at the edges of wafers, as often associated with batch cleaners, which work via series of immersions in chemical baths. In some embodiments, the cleaning process is performed using diluted HF at a concentration of 0.5% or greater. Preferably, the cleaning process is performed using diluted HF at a concentration of between 1% and 5%. More preferably, the cleaning process is performed using diluted HF at a concentration of between 2% and 5%. Any conventional SWCs can be used in the cleaning process. Various documents have been reported relating to the manufacture of SWCs, for example, U.S. Pat. Nos. 5,148,823, 6,730,176B2, and others.

Figure 5A:
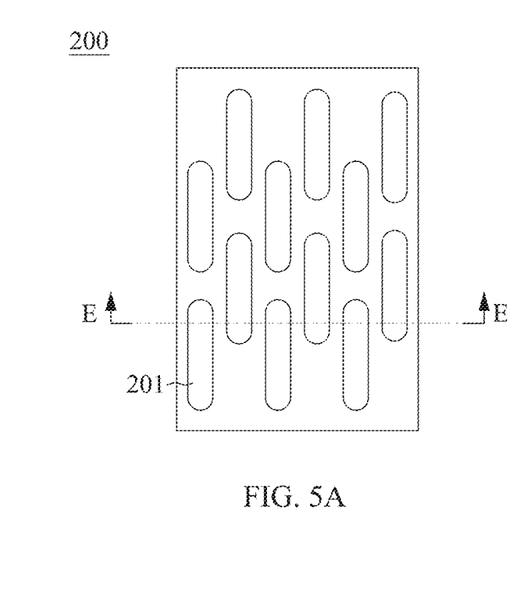
FIG. 5A is a top view of the semiconductor structure after step S104 in FIG. 1 is performed.
Figure 5B:
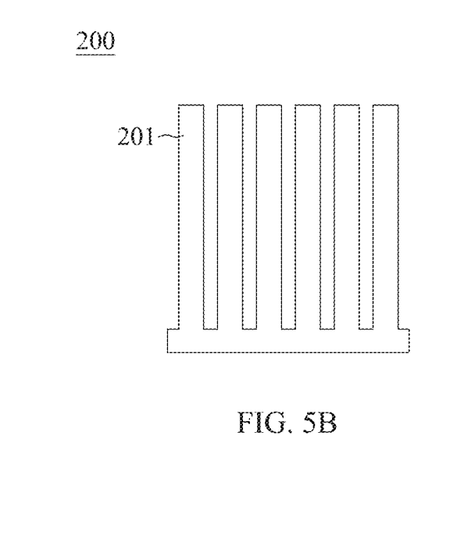
FIG. 5B is a schematic cross-sectional view, taken along line E-E in FIG. 5A, of the semiconductor structure after the step S104 in FIG. 1 is performed.
Figure 5C:
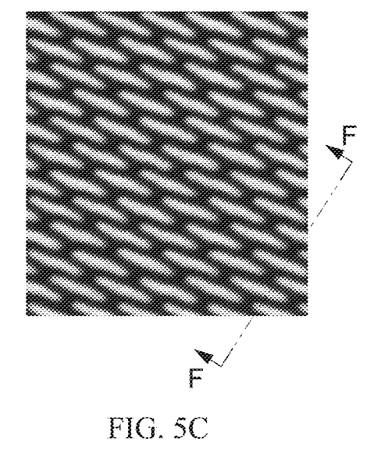
FIG. 5C is a micrograph of a top view of the semiconductor structure after the step S104 in FIG. 1 is performed.
Figure 5D:
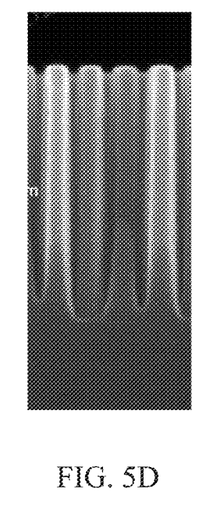
FIG. 5D is a micrograph of a schematic cross-sectional view, taken along line F-F in FIG. 5C, of the semiconductor structure after the step S104 in FIG. 1 is performed.

With reference to FIG. 1 and FIGS. 5A and 5B, in the step S104, the substrate 201 is subjected to a vapor-etching process using an HF vapor. In some embodiments, the vapor-etching process is performed with an HF vapor in the presence of alcohols. Alcohol ionizes the HF vapor and acts as a catalyst. The HF vapor-etching process can be performed using any commercially available HF vapor-etch systems, for example, Primaxx® Monarch 25, Primaxx® Monarch 3, or Primaxx® Uetch manufactured by SPTS Technologies.

Optionally, after the vapor-etching process, a conductive material such as aluminum, copper, tungsten, cobalt, or other suitable metal or metal alloy may be deposited by a metallization process such as chemical vapor deposition, physical vapor deposition, sputtering or the like, in the multiple high aspect ratio STI features.

Due to the design of the wet clean process of the present disclosure, namely, by performing post RIE using a fluorine-containing gas such as $C_2F_6$ followed by cleaning in an SWC with diluted HF or in a solution of ammonia and HF, the present disclosure enables a substrate with multiple pattern collapse free high aspect ratio STI features to be achieved. Due to a significant reduction or elimination of pattern collapse in the semiconductor device, a yield of the semiconductor device is increased.

It should be understood that the preceding examples are included to demonstrate specific embodiments of the present disclosure. It should be appreciated by those of skill in the art that the techniques disclosed in the examples which follow represent techniques discovered by the inventors to function well in the practice of the present disclosure, and thus can be considered to constitute preferred modes for its practice. However, it should also be understood that the present disclosure is not intended to be limited to the particular forms disclosed. Rather, the different aspects of the disclosed process may be utilized in various combinations and/or independently. Thus, the present disclosure is not limited to only those combinations shown herein, but rather may include other combinations. Further, those of skill in the art should, in light of the present disclosure, appreciate that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A wet clean process for fabricating semiconductor devices, comprising the steps of:
    providing a substrate comprising a pad oxide layer disposed above the substrate, and an oxide layer disposed above the pad oxide layer;
    dry etching the substrate to form multiple high aspect ratio shallow trench isolation (STI) features on the substrate and to simultaneously remove the oxide layer from the substrate;
    cleaning the substrate in a single wafer cleaner (SWC) with diluted hydrofluoric acid (HF) or in a solution of ammonia and HF to remove the pad oxide layer and polymer residues left behind by the dry-etching step; and
    vapor etching the substrate with an HF vapor to form a substrate with multiple pattern collapse free high aspect ratio STI features.

2. The process according to claim 1, wherein the substrate is a silicon-on-insulator (SOI) substrate.

3. The process according to claim 1, wherein the pad oxide layer is a $SiO_2$ buffer layer.

4. The process according to claim 1, wherein the pad oxide layer is grown on the substrate by thermal oxidation at a temperature ranging from 800° C. to 1,200° C.

5. The process according to claim 1, wherein the oxide layer is a tetraethylorthosilicate (TEOS) layer.

6. The process according to claim 1, wherein the dry etching is performed by post reactive ion etching (RIE) using a fluorine-containing gas.

7. The process according to claim 6, wherein the fluorine-containing gas is selected from the group consisting of $CF_4$, $CH_2F_2$, $CHF_3$, and $C_2F_6$.

8. The process according to claim 7, wherein the fluorine-containing gas is $C_2F_6$.

9. The process according to claim 1, wherein the dry-etching step forms multiple high aspect ratio STI features on the substrate, wherein an aspect ratio of at least a portion of the multiple high aspect ratio STI features is 20:1 or greater.

10. The process according to claim 9, wherein the dry-etching step forms multiple high aspect ratio STI features on the substrate, wherein an aspect ratio of at least a portion of the multiple high aspect ratio STI features is between 20:1 and 60:1.

11. The process according to claim 9, wherein the dry-etching step forms multiple high aspect ratio STI features on the substrate, wherein an aspect ratio of at least a portion of the multiple high aspect ratio STI features is between 30:1 and 60:1.

12. The process according to claim 1, wherein the cleaning step is performed using diluted HF at a concentration of 0.5% or greater.

13. The process according to claim 12, wherein the cleaning step is performed using diluted HF at a concentration of between 1% and 5%.

14. The process according to claim 1, wherein the vapor-etching step is performed with an HF vapor in the presence of alcohols.

\* \* \* \* \*